United States Patent [19]
Hofmann et al.

[11] Patent Number: 5,258,712
[45] Date of Patent: Nov. 2, 1993

[54] SAMPLE HEAD FOR FLOWTHROUGH NMR SPECTROSCOPY

[75] Inventors: Martin Hofmann, Rheinstetten; Manfred Spraul, Ettlingenweiler, both of Fed. Rep. of Germany

[73] Assignee: Bruker Analytische Messtechnik GmbH, Rheinstetten, Fed. Rep. of Germany

[21] Appl. No.: 822,400

[22] Filed: Jan. 17, 1992

[30] Foreign Application Priority Data

Jan. 19, 1991 [DE] Fed. Rep. of Germany ....... 4101473

[51] Int. Cl.⁵ .............................................. G01R 33/20
[52] U.S. Cl. .................................................... 324/318
[58] Field of Search ............... 324/300, 302, 304, 307, 324/318, 321, 322

[56] References Cited

U.S. PATENT DOCUMENTS

| | | | |
|---|---|---|---|
| 3,764,892 | 10/1973 | Rollwitz | 324/322 |
| 3,789,060 | 1/1974 | Goering et al. | 324/300 |
| 3,915,641 | 10/1975 | Goering et al. | 324/304 |
| 3,931,569 | 1/1976 | Hyde | 324/316 |
| 4,201,941 | 5/1980 | Fyfe et al. | 324/321 |
| 4,246,537 | 1/1981 | Laukien | 324/321 |
| 4,411,789 | 10/1983 | Liburdy | 210/635 |
| 5,179,338 | 1/1993 | Laskaris et al. | 324/318 |

FOREIGN PATENT DOCUMENTS 0068343 1/1983 European Pat. Off. .

OTHER PUBLICATIONS

Rev. Sci. Instrum. 56(4), Apr. 1985, pp. 603-606, van der Putten et al.: Low-temperature, high-pressure apparatus for nuclear-magnetic-resonance experiments.

Primary Examiner—Michael J. Tokar
Attorney, Agent, or Firm—Thomas R. Vigil

[57] ABSTRACT

The invention concerns head for flowthrough NMR spectroscopy in which there is provided, in the interior of a vessel, a replaceable quartz cuvette which can be separated from the vessel, and eluent inflow and outflow tube, and a measurement coil, and which has end sections which seal with respect to the vessel.

The parts constituting the vessel, namely a cylindrical glass casing, a cover, and a base, as well as the replaceable quartz cuvette, can be clamped together with a simple clamping device in such a way that the sample head according to the invention can also be used for high pressure, such as those which occur with SFC (supercritical fluid chromatography) NMR measurements.

12 Claims, 4 Drawing Sheets

SAMPLE HEAD FOR FLOWTHROUGH NMR SPECTROSCOPY

BACKGROUND OF THE INVENTION

The invention concerns a sample head for flowthrough NMR spectroscopy with a measurement cell, an inflow tube through which an eluent flows into the measurement cell, an outflow tube through which the eluent coming from the measurement cell flows out, a measurement coil surrounding the measurement cell, and a vessel encasing and thermally shielding the measurement cell.

In flowthrough NMR spectroscopy, an eluent under pressure flows through a measurement cell that is located in a sample head in the magnetic field of the spectrometer, and from there flows back to a collection container.

FIG. 1 shows a schematic depiction of a known sample head for flowthrough NMR spectroscopy. Located in the interior of a glass cylinder 11, configured for example as a Dewar vessel 1, which has a cover 12 and a base 12', is a glass measurement cell 13, the interior of which has a predefined measurement volume. A radiofrequency measurement coil 16 is provided around the outer wall of the measurement cell 13. The coil 16 is generally configured as a saddle coil which generates in the vicinity of the measurement coil a radiofrequency field that runs perpendicular to the long axis of the glass cylinder 11, while the static magnetic field of the spectrometer is oriented along that axis. With flowthrough NMR spectroscopy, measurements can be made not only with continuously flowing eluent (continuous-flow process) but also when the eluent flow is discontinuous (stop-flow process).

To prevent, especially with the stop-flow process, any backmixing of the substance being measured, which might, for example, lead to smearing of the chromatographic peaks measured in the NMR spectrometer, a very thin inflow tube 14, having an inside diameter in the range 0.1 to 0.5 millimeter, is necessary. A glass measurement cell 13 that is drawn out at its lower end into such a capillary then has at that end only a very thin wall, which can break under very little force.

To prevent gassing with certain eluent mixtures, a certain back pressure on the order of 5 to 10 bars must be present.

With SFC (supercritical fluid chromatography) measurements, the equipment is operated at very high pressures, on the order of several hundred bars.

It is therefore necessary to provide a suitably insensitive, leakproof and pressure-stable joint between the inflow capillary tube and the measurement cell, and between the outflow capillary tube and the measurement cell.

Until now the approach to creating the aforesaid transition point has been to make do by shrinking narrow Teflon tubes of different diameters, in a stepwise fashion, onto the ends of glass measurement cells that are only slightly tapered.

However, such improvised transition points often fail to meet sealing requirements and also cannot withstand the pressures referred to earlier. But poorly sealed measurement cells yield inaccurate readings and result in damage to the sample head electronics due to organic solvents and water, and measurements often must be interrupted to replace the sample head.

A further disadvantage of this known sample head shown in FIG. 1 is the fact that the return section of the outflow tube 15 is located within the interior of the sample head vessel 1 and thus in the vicinity of the RF measurement coil 16. The material flowing out through the outflow tube 15 thus contributes to the reading, and can undesirably decrease its accuracy. If the measurement cell depicted in FIG. 1 needs to be replaced, for another measurement, by another measurement cell that, for example, has a different interior volume or a different wall thickness, the entire arrangement—consisting of the measurement cell and the inflow and outflow tube shrunk onto it—must be replaced. To do so, the RF coil must be unsoldered, the cover 12 and base 12' must be removed from the glass cylinder 11, and the inflow and outflow tube must be withdrawn from the base.

SUMMARY OF THE INVENTION

The object of the invention is therefore to make possible a sample head for flowthrough NMR spectroscopy in such a way that the measurement cell can be replaced in the sample head, which is suitable for measurements at high pressures up to several hundred bars and in which the aforementioned problem of the transition points between measurement cell and both inflow tube and outflow tube is eliminated.

A sample head which achieves the above object is characterized in that the measurement cell is a replaceable quartz cuvette which can be separated from the vessel, the inflow and outflow tube, and the measurement coil, and which has end sections that seal with respect to the vessel.

The result, according to the invention, is that the measurement cell located in the sample head can be adapted to the specific application in terms of its interior volume, shape, wall thickness, and material. The entire sample head arrangement is advantageously usable for high pressures in the eluent path if the quartz cuvette has correspondingly thick walls and the seals at its end sections are designed for such pressures.

According to one preferred embodiment, a doublewalled glass cylinder, a cover, and a base, each of which are sealed with sealing rings between the end edges of the glass cylinder and the inner sides of the cover and base, form a measurement chamber in which are located the replaceable glass cuvette (representing the measurement cell) and the measurement coil.

In one embodiment, the replaceable quartz cuvette is ground so as to taper conically at its ends. These conically tapered ends fit into an upper and lower gauged hole which are ground into the sides of the cover and the base, respectively, which face the measurement chamber, so that the conically tapered ends of the quartz cuvette seal against the cover and the base in a gas- and liquid-tight manner even at high pressures.

Furthermore, sealing rings can be provided between the respective end faces of the quartz cuvette and the cover and base of the vessel.

This further increases the pressure tightness of the eluent pathway.

Preferably, both the inflow tube and the outflow tube are each configured as a flexible capillary tube, made for example of PEEK. An upper and a lower joining element in each case join the outflow tube to the cover and the inflow tube to the base, and the cover and base each have a capillary bore as an extension of the joining elements, which communicate with the interior of the measurement cell and the respective capillaries of the outflow and inflow capillary tube through the joining elements, with the diameters of the capillary bores being in each case slightly greater than the inside diameter of the inflow and outflow capillary tube. As a result of these features, the eluent flowing in and out can flow into or out of the measurement cell without discontinuities.

Preferably, the entire sample head arrangement is essentially cylindrical and axially symmetrical. The vessel then consists of a double-walled cylindrical glass casing, a cylindrical cover, and a cylindrical base. The measurement cell and the joining elements for the inflow and outflow tubes are each provided centrically and in axial orientation in the glass casing and in its base and cover; the outflow tube emerging from the cover, however, is led down outside the vessel to its base. This results in a relatively large distance between the measurement coil and the outflowing material, so that measurement results are not significantly degraded by the outflowing material.

Preferably the outflow tube is guided back at a predefined angle relative to the axis of the saddle coil, specifically in such a way that the RF leakage field of the saddle coil is minimized at the location of the outflow tube. The outflow tube can also be electromagnetically shielded from the RF coil.

To ensure axially symmetrical distribution of the clamping forces that clamp the vessel and the measurement cell together, a clamping device is provided which clamps the vessel cylinder, the cover, and the base together, and simultaneously presses the quartz cuvette into the gauged holes in the cover and the base.

Preferably the clamping device is configured as a plurality of clamping bolts, arranged with axial symmetry outside the vessel in the edge region of the cover and base. These clamping bolts pass through respective holes in the edge region of the base and cover and, when they are uniformly tightened together, can uniformly distribute the desired clamping forces in an axially symmetrical manner.

In an alternative embodiment, the clamping device consists of an external axially symmetrical clamping frame surrounding the vessel, and of axial clamping screws that are threaded from outside through the clamping frame and press respectively on an upper and lower inner clamping element, with the inner clamping elements being configured so that they distribute the clamping pressure exerted by the clamping screws uniformly over the edge regions of the cover and base. This axially symmetrical clamping frame can be configured as a cylindrical casing surrounding the vessel on all sides, which has in its end regions transverse webs joined to the said cylindrical casing, through which the clamping screws are threaded.

In one embodiment of the invention, the sample head has a vessel, with the cover and the base each being provided with openings through which a temperature-control fluid, generally air, can flow.

With this embodiment it is possible, as is required for many measurements, to keep the material flowing through the interior of the quartz cuvette at a desired temperature during the measurement.

The materials used for the vessel, the vessel base, the cover, the clamping device, the joining elements, and the inflow and outflow tubes are preferably non-magnetic.

Such materials are known to the person skilled in the art of NMR spectroscopy. These include, for example, ceramic materials, such as PEEK, glass materials, and plastic materials, such as Teflon.

Moreover, the outer wall of the glass casing can be vacuum-coated with a thin layer of metal in the vicinity of the outflow tube in order to provide electromagnetic shielding. This prevents the measurement coil from picking up a signal from the outflow tube.

BRIEF DESCRIPTION OF THE DRAWINGS

The invention will be described below in more detail in a number of exemplary embodiments with reference to the drawings, in which.

DESCRIPTION OF THE PREFERRED EMBODIMENTS

Figure 1:
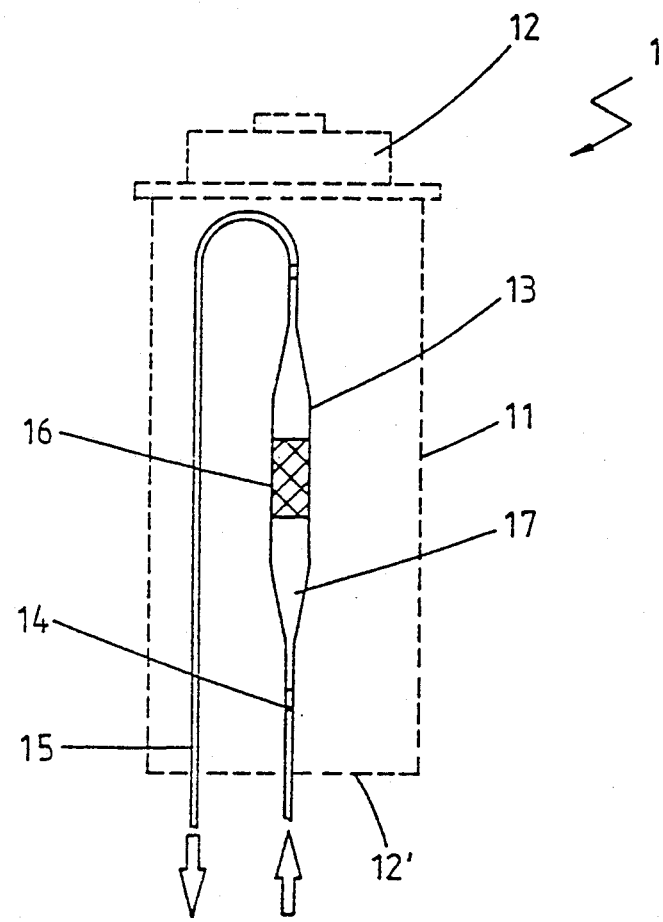
FIG. 1 shows a schematic depiction of a sample head for flowthrough NMR spectroscopy according to prior art.
Figure 2A:
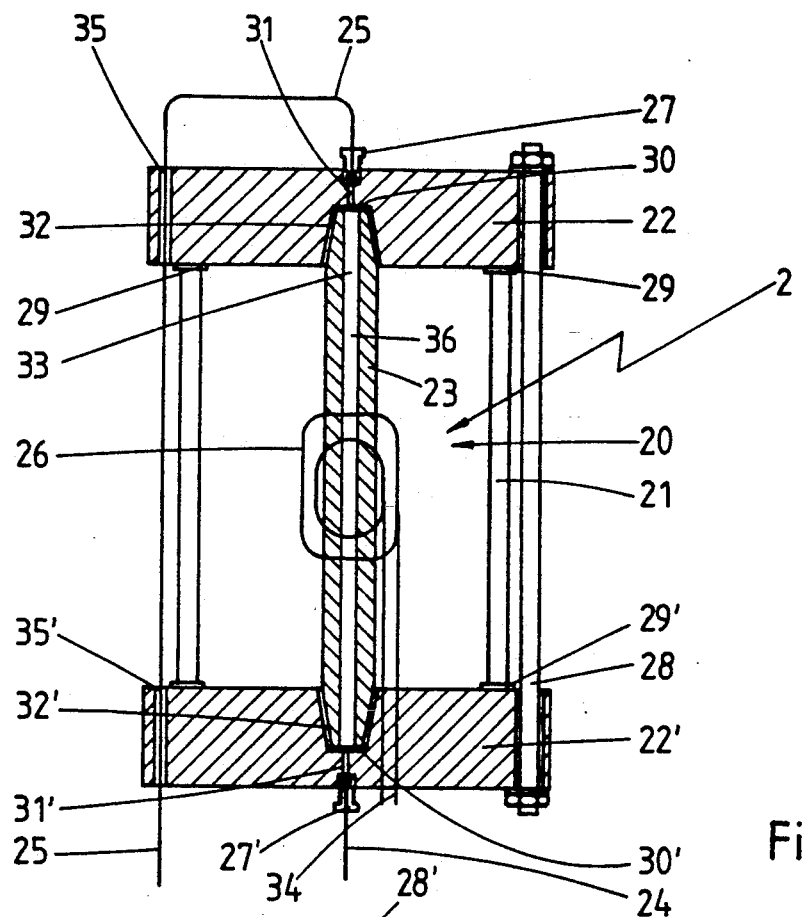
FIGS. 2A and 2B are each schematic sectioned depictions of a first embodiment of a sample head according to the invention, in a front view and in the base region.
Figure 2B:
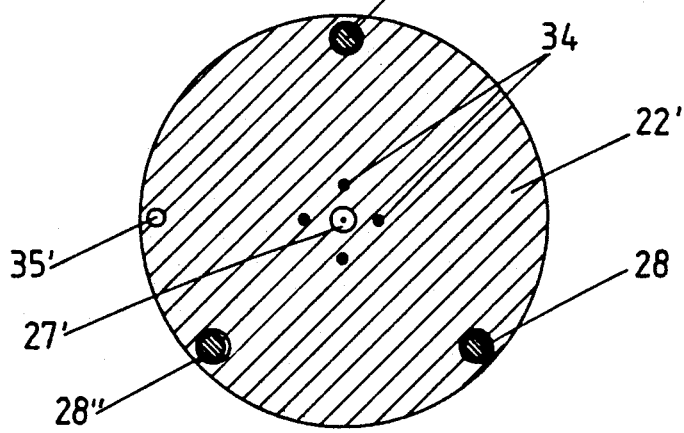

FIGS. 2A and 2B show a first embodiment of the sample head according to the invention in schematic sectioned depictions, in a front view and a view of the base region, respectively.

FIG. 2A shows that the first embodiment has a vessel 2 that consists of a glass cylinder 21, a cover 22, and a base 22'. FIGS. 2A and 2B together show that the overall structure of the sample head is circularly symmetrical, with a quartz cuvette 23, constituting the measurement cell, being inserted in the center of the vessel in an axial position. This quartz cuvette 23 is designed to be replaceable, and after the cover 22 of the vessel is removed, can be with drawn from a saddle-type measurement coil 26.

According to FIG. 2A, the quartz cuvette has an interior 36 of constant cross section. The interior 36 is open at the two end faces of the quartz cuvette 23. The end sections of the quartz cuvette 23 are ground externally to a conical taper, and these end sections fit into an upper and a lower gauged hole 32 and 32' which are ground into the sides of the cover 22 and base 22', respectively, which face the measurement cell 20, so that the conically tapered end sections of the quartz cuvette 23 seal in a gas- and liquid-tight manner against the cover 22 and base 22'.

In addition, sealing rings 30 and 30' are provided between the end faces and the bottom surfaces of the gauged holes 32 and 32' opposite them. Provided in the center of the cover 22 and the base 22' are capillary bores 31 and 31' respectively, which communicate with the interior 36 of the quartz cuvette 23. On their exteriors, the cover 22 and the base 22' are each provided with an axial threaded hole, each of which is aligned with and joined to the corresponding capillary bore 31 and 31'. These threaded holes in the cover 22 and base 22' each serve to accommodate an upper and lower joining element 27 and 27'. The lower joining element 27' joins an eluent inflow capillary tube 24 to the vessel 2. Similarly, the upper joining element 27 joins an eluent outflow capillary tube 25 to the cover 22 of the vessel 2. The continuation of the eluent outflow capillary tube 25 leads through an upper and lower guide bore 35 and 35' in the edge region of the cover 22 and base 22', respectively. Also present in the base 22' are additional openings through which the leads 34 are guided to the measurement coil 26. Additional openings in the base 22' and/or in the cover can be provided for the delivery of temperature-control air and for the leads to a temperature sensor (not depicted).

The diameter of the capillary bores 31 and 31' in the cover 22 and base 22' is selected to correspond to the respective capillary diameter of the eluent outflow capillary tube 25 and the eluent inflow capillary tube 24, and is, for example, 0.8 mm for 1/16" capillaries with an inside diameter of 0.1 to 0.5 mm. FIG. 2B shows clearly that the sample head 2 is clamped together with three axially symmetrical clamping bolts 28, 28', and 28".

When these clamping bolts 28, 28', and 28" are uniformly tightened, the pressure that they exert is uniformly distributed over the cross-sectional area of the cover 22 and the base 22', with these being pressed against the end faces of the glass cylinder 21.

Sealing rings 29 and 29', that become compressed when the clamping bolts 28, 28', and 28" are tightened, are provided between the interior surfaces of the cover 22 and the base 22' and the respective edges of the glass cylinder 21 located opposite them. At the same time, the conically tapered end sections of the quartz cuvette 23 are thereby pressed into the respective gauged holes 30 and against the sealing rings 30 and 30'.

When clamped together, the sample head vessel 2 depicted in FIGS. 2A and 2B constitutes a measurement chamber 20 which contains inside it the quartz cuvette 23, the interior 36 of which sealed against gas and liquid leakage, even at high pressures, with respect to the cover 22 and base 22'.

The interior 36 of the quartz cuvette 23 communicates with the eluent inflow capillary tube 24 (which is joined in a gas- and liquid-tight manner, by means of the lower joining element 27', to the base 22') and with the eluent outflow capillary tube 25 (which is joined in a gas- and liquid-tight manner, by means of the upper joining element, to the cover 22). The extended eluent outflow capillary tube 25 is guided, outside the vessel 2, down through the guide holes 35 and 35' in the edge regions of the cover 22 and base 22' respectively, in such a way that the material flowing out through the outflow capillary tube 25 does not influence the results of the NMR spectroscopy measurement. Commercially available Teflon or PEEK capillary tubes and fittings can be used for the eluent inflow capillary tube 24 and the lower joining element 27' associated with it, and for the eluent outflow capillary tube 25 and the upper joining element 27' associated with it. The cover 22 and base 22' are preferably made of Teflon or PEEK or ceramic.

The clamping bolts 28, 28', and 28" can be made of non-magnetic metal or also of PEEK, so that the entire sample head structure contains no materials that might interfere with NMR measurements.

Altogether, the first embodiment of a sample head according to the invention as shown in FIGS. 2A and 2B allows flowthrough NMR spectroscopy in the SFC region as well, since it is suitable for the high pressures (several hundred bars) which occur with such measurements.

By simply loosening the clamping bolts, the sample head according to FIGS. 2A and 2B can be taken apart and the quartz cuvette 23 replaced, so that the sample head or the measurement cell can be adapted to various measurement conditions by means of a variable internal volume and a variable wall thickness for the quartz cuvette 23.

Figure 3:
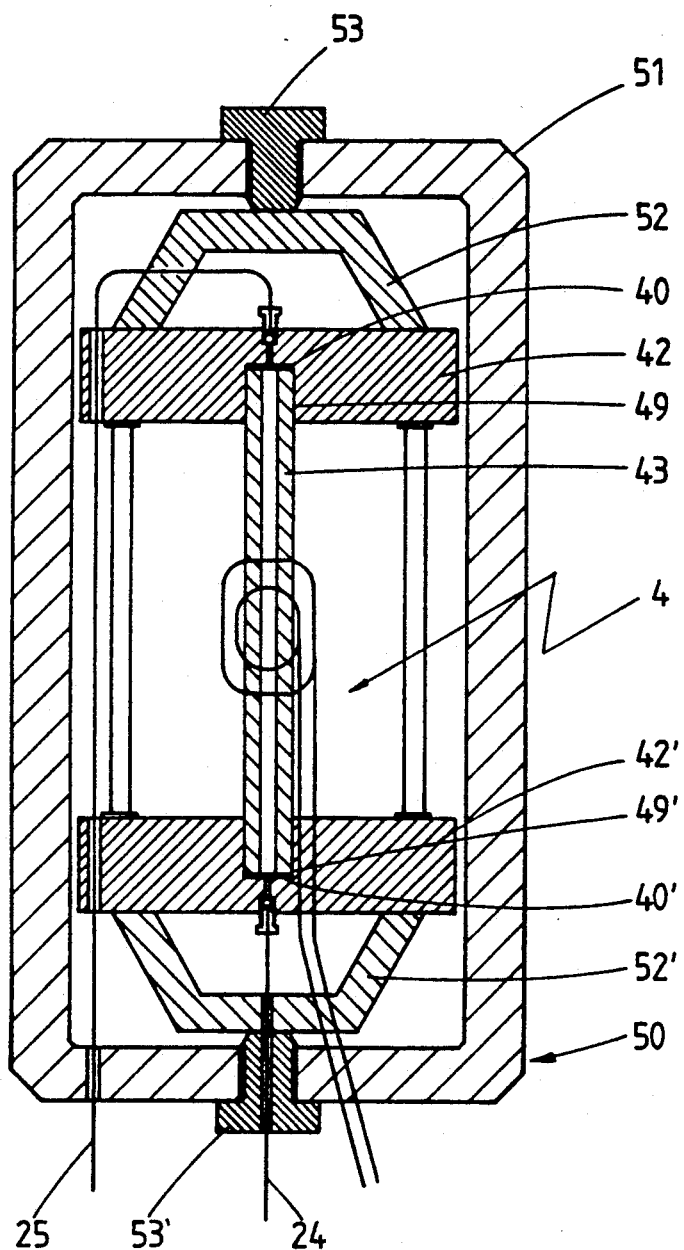
FIG. 3 is a schematic sectioned depiction of a second embodiment of a sample head according to the invention.

FIG. 3 shows a second embodiment of a sample head according to the invention.

The parts identical to the first embodiment shown in FIG. 2A are not re-labeled, and are explained in the following description only if they are relevant to the functional description.

Located in the interior of the vessel 4 is a quartz cuvette 43 which does not have any externally tapered end sections. Instead, this cylindrical quartz cuvette sits in bores 49 and 49', also cylindrical, one each in the inner sides of the cover 42 and base 42'. Sealing rings 40 and 40' or sealing washers are provided between the end faces of the quartz cuvette 43 and the base surfaces of the aforesaid bores in order to seal the interior of the quartz cuvette 43. A clamping device 50, which consists of an outer clamping frame 51 and an upper and a lower internal clamping element 52 and 52', as well as an upper and a lower clamping screw 53 and 53', is provided around the vessel 4. When the clamping screws 53 and 53', which act axially upon the inner clamping elements 52 and 52', are tightened, the clamping forces are uniformly distributed over the periphery of the cover 22 and base 22'.

Advantageously, the eluent inflow capillary tube 24 is guided through a central hole through the lower clamping screw 53 and the lower inner clamping element 52'.

If necessary, the outer clamping frame 51 can be configured in the form of a cylindrical casing surrounding the sample head on all sides, with the upper and lower clamping screws 53 and 53' then being threaded through cover and base elements permanently joined to this outer cylindrical casing, for example a cover web and a base web.

The inner clamping elements are preferably provided with a centering device (not shown in FIG. 3), so that the clamping screws 53 and 53' act in a precisely centered manner.

All the parts of the clamping device 50 according to FIG. 3 are preferably made of non-magnetic material, especially plastic, which influences the NMR measurement as little as possible.

The sample head depicted in FIG. 3 is also designed for high pressure and, depending on the measurement conditions used, allows the quartz cuvette 43 to be replaced by simply loosening the axial clamping screws 53 and 53'.

Figure 4:
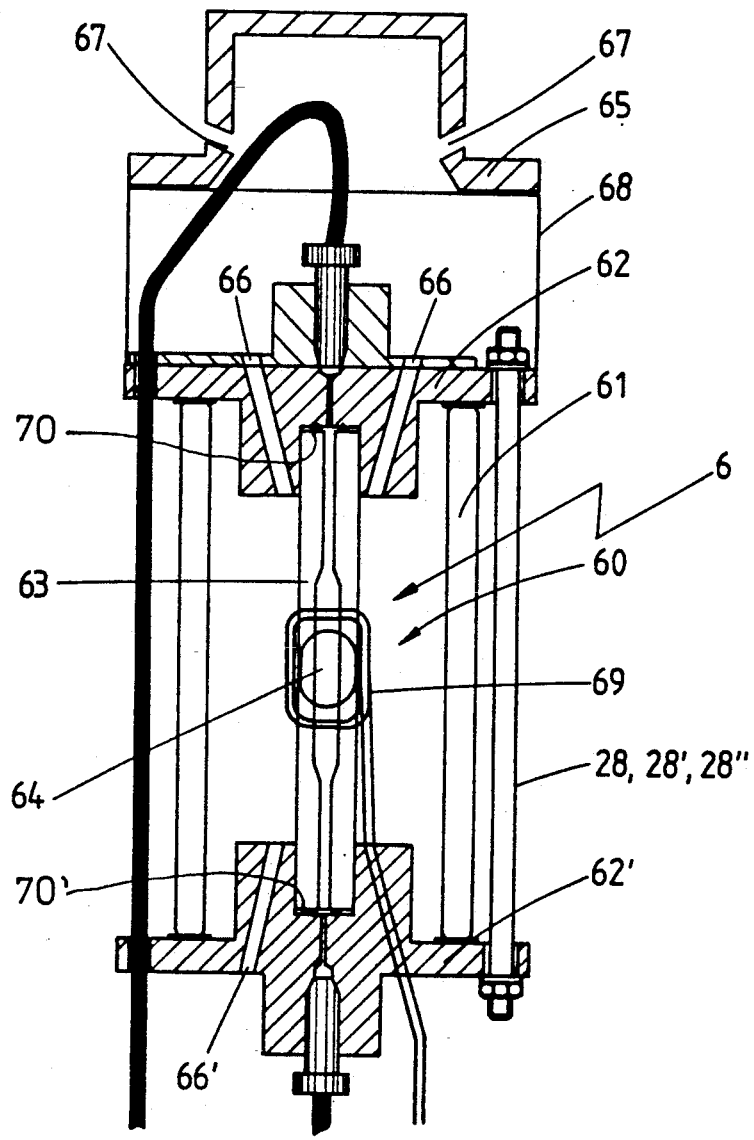
FIG. 4 is a schematic sectioned depiction of a third embodiment of a sample head according to the invention.

FIG. 4 depicts a third embodiment of a sample head according to the invention. In this depiction also, the parts identical to those in FIG. 2A and FIG. 3 are not labeled and will be explained in the description below only if they are essential for the functional description.

The third embodiment depicted in FIG. 4 contains a low-pressure quartz cuvette 63 inside the sample head 6. The interior 64 of the quartz cuvette 63 flares out in the region of the measurement coil, resulting in an overall increase in the measurement volume of the eluent flowing through the quartz cuvette.

Since with certain measurements it is necessary to keep the measurement cell and the material inside it within a certain temperature range, openings 66 and 66' which introduce a temperature-control fluid into the measurement chamber 60 and drain it out therefrom are provided in a cover 62 and in a base 62' of the vessel.

These openings 66 and 66' are provided obliquely in the cover 62 and in the base 62', so that the temperature-control fluid flowing in through the openings 66 directly bathes the outer wall of the quartz cuvette 63 and from there can flow back out through the lower opening 66. A lower opening (not shown) can be provided for a temperature sensor.

The third embodiment also has, in particular, a sample head cap 65 that is joined by means of a spacer ring 68 to the cover 62, with connection openings 67 for connecting temperature-control fluid lines being provided in the upper region of the sample head cap 65.

The third embodiment shown in FIG. 4 also has sealing rings or sealing washers 70 and 70' between the each end face of the quartz cuvette 63 and the base surfaces of the bores in the cover 62 and the base 62', into which the end sections of the quartz cuvette project; this allows simple assembly and disassembly of the sample head using clamping bolts 28, 28', and 28" according to FIG. 2, and therefore simplifies replacement of the quartz cuvette 63 inside the measurement chamber 60.

It is self-evident that the three embodiments of the invention described above can be changed, combined, and developed in various ways, in the context of the capability of a person skilled in the art, without deviating from the gist of the present invention. For example, the outer wall of the cylinder 21 forming the vessel wall 21 in FIG. 2B or 61 in FIG. 4, or portions thereof, can be vacuum-coated with a thin layer of metal for electromagnetic shielding.

However, it is a fact common to all the embodiments that the measurement cell is a replaceable quartz cuvette which can be separated from the vessel surrounding it, the inflow and outflow tubes, and the measurement coil, and which has end sections that seal with respect to the vessel and allow higher working pressures.

We claim:

1. Sample head for flowthrough NMR spectroscopy, with
    a measurement cell (23; 43);
    an inflow tube (24) through which an eluent is delivered to the measurement cell;
    an outflow tube (25) through which the eluent coming from the measurement cell flows out;
    a measurement coil (26) surrounding the measurement cell; and
    a vessel (2; 4; 6) encasing and thermally shielding the measurement cell, wherein
the measurement cell (23; 43) is a replaceable quartz cuvette which can be separated from the vessel (2; 4; 6), the inflow and outflow tube (24, 25), and the measurement coil (26), and which has end sections (32, 32'; 49, 49') that seal with respect to the vessel.

2. Sample head according to claim 1, wherein the vessel (2; 4; 6) surrounding the cell consists of a double-walled glass cylinder (21), a cover (22; 42), and a base (22'; 42'), which form a measurement chamber (20) that is sealed with respect to the outside with sealing rings (29, 29') between the glass cylinder (21) and the cover (22) and base (22 ), respectively.

3. Sample head according to claim 1, wherein the end sections of the quartz cuvette are externally ground so as to taper conically and are fitted into an upper and lower gauged hole (32, 32') which are ground into the sides of the cover (22) and the base (22'), respectively, which face the measurement chamber (20), so that the conically tapered ends of the quartz cuvette seal against the cover and the base in a gas- and liquid-tight manner.

4. Sample head according to claim 1, wherein sealing rings or sealing washers (30, 30'; 40, 40') are provided which are inserted between the end faces of the quartz cuvette and the cover (22) and base (22'), respectively.

5. Sample head according to claim 1, wherein the inflow and the outflow tube (24, 25) are each configured as a flexible capillary tube; an upper and a lower joining element (27, 27') are provided, which respectively join the outflow tube (25) to the cover (22; 42; 62) and the inflow tube (24) to the base (22'; 42'; 62'); and a cover (22; 42; 62) and a base (22'; 42'; 62') of the vessel (2; 4; 6) each have a capillary bore (31, 31') that communicates with the interior (36) of the measurement cell (23) and the capillaries of the outflow and inflow capillary tube (25, 24) through the joining elements (27, 27'), with the diameters of the capillary bores being in each case slightly greater than the inside diameter of the inflow and outflow capillary tube (24, 25).

6. Sample head according to claim 5, wherein the vessel (2; 4; 6) consists of a double-walled cylindrical glass casing (21), a cylindrical cover (22; 42; 62), and a cylindrical base (22'; 42'; 62'); and the measurement cell (23; 43; 63) and the joining elements for the inflow and outflow tubes (24, 25) are each provided centrically and in axial orientation in the vessel and in its base (22') and its cover (22), with the outflow tube (25) emerging from the cover (22) being led down outside the vessel to its base (22').

7. Sample head according to claim 5, wherein a clamping device (28, 28', 28"; 50, 51, 52, 52', 53, 53') is provided which clamps the glass casing (21), the cover, and the base together, and simultaneously presses the quartz cuvette (23; 43; 63) into the gauged holes in the cover (22; 42; 62) and the base (22'; 42'; 62').

8. Sample head according to claim 7, wherein the clamping device is configured as a plurality of clamping bolts (28, 28', 28"), which are arranged with axial symmetry outside the vessel (2; 4; 6) in the edge region of the cover (22) and base (22').

9. Sample head according to claim 7, wherein the clamping device (50) has
    an external axially symmetrical clamping frame (51) surrounding the vessel (4); and
    axial clamping screws (53, 53') that are threaded from outside through the clamping frame (51) and press respectively on an upper and lower inner clamping element 52, 52'), with the inner clamping elements (52, 52') being configured so that they distribute the clamping pressure exerted by the clamping screws uniformly over the edge regions of the cover (42) and base (42').

10. Sample head according to claim 5, wherein the cover (62) and the base (62') of the vessel (6) are each provided with openings (66, 66') through which a temperature-control fluid can flow.

11. Sample head according to claim 7, wherein the base, the cover, the clamping device, the joining elements, and the inflow and outflow tubes are made of non-magnetic materials.

12. Sample head according to claim 1, wherein electromagnetic shielding of the outflow tube (25) from the measurement coil (26) is provided.

* * * * *

UNITED STATES PATENT AND TRADEMARK OFFICE
CERTIFICATE OF CORRECTION

PATENT NO. : 5,258,712
DATED : November 2, 1993
INVENTOR(S) : MARTIN HOFMANN and MANFRED SPRAUL It is certified that error appears in the above-indentified patent and that said Letters Patent is hereby corrected as shown below:

Column 7, line 63 "and base (22)" should be --and base (22')--.

Column 8, line 51 "52," should be (52,--.

Abstract, line 1 "concerns head" should be --concerns a sample head--.

Signed and Sealed this

Seventh Day of June, 1994

BRUCE LEHMAN

*Attest:*

*Attesting Officer*  Commissioner of Patents and Trademarks